United States Patent
Li et al.

(10) Patent No.: US 7,697,294 B2
(45) Date of Patent: Apr. 13, 2010

(54) HEAT DISSIPATION DEVICE HAVING AN IMPROVED FIN STRUCTURE

(75) Inventors: Wu Li, Shenzhen (CN); Yi-Qiang Wu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/255,663

(22) Filed: Oct. 21, 2008

(65) Prior Publication Data

US 2009/0316362 A1 Dec. 24, 2009

(30) Foreign Application Priority Data

Jun. 20, 2008 (CN) .................. 2008 1 0067943

(51) Int. Cl.
*H05K 7/20* (2006.01)
(52) U.S. Cl. .................. 361/709; 361/679.54; 361/703; 361/704; 361/710; 165/78; 165/80.3; 165/185; 174/16.3; 257/722
(58) Field of Classification Search ............ 361/679.46, 361/679.47, 679.54, 676, 703–712; 165/78, 165/80.3, 104.33, 185; 257/706–727; 174/15.1, 174/16.3, 252
See application file for complete search history.

(56) References Cited

U.S. PATENT DOCUMENTS

| | | | | |
|---|---|---|---|---|
| 5,761,811 A * | 6/1998 | Ito | .................. | 29/890.054 |
| 6,449,160 B1 * | 9/2002 | Tsai | .................. | 361/709 |
| 6,474,407 B1 * | 11/2002 | Chang et al. | .................. | 165/80.3 |
| 6,607,023 B2 * | 8/2003 | Ho et al. | .................. | 165/78 |
| 6,672,379 B1 * | 1/2004 | Wang et al. | .................. | 165/185 |
| 6,765,799 B1 * | 7/2004 | Huang | .................. | 361/709 |
| 6,880,621 B2 * | 4/2005 | Wang | .................. | 165/80.3 |
| 6,942,026 B2 * | 9/2005 | Lin et al. | .................. | 165/185 |
| 6,995,981 B2 * | 2/2006 | Huang et al. | .................. | 361/703 |
| 7,025,122 B2 * | 4/2006 | You-Tien | .................. | 165/80.3 |
| 7,028,755 B2 * | 4/2006 | Fu et al. | .................. | 165/80.3 |
| 7,032,650 B1 * | 4/2006 | Tian | .................. | 165/80.3 |
| 7,104,311 B1 * | 9/2006 | Teng | .................. | 165/80.3 |
| 7,121,326 B2 * | 10/2006 | Lee et al. | .................. | 165/80.3 |
| 7,163,049 B2 * | 1/2007 | Zhong et al. | .................. | 165/80.3 |
| 7,165,601 B1 * | 1/2007 | Hashimoto | .................. | 165/78 |
| 7,174,955 B2 * | 2/2007 | Zhong et al. | .................. | 165/185 |
| 7,190,588 B2 * | 3/2007 | Lee et al. | .................. | 361/704 |
| 7,409,983 B2 * | 8/2008 | Lin | .................. | 165/80.3 |
| 7,461,686 B2 * | 12/2008 | Fan Chiang | .................. | 165/78 |
| 2004/0207984 A1 * | 10/2004 | Huang et al. | .................. | 361/703 |
| 2005/0115702 A1 * | 6/2005 | Lin et al. | .................. | 165/185 |

(Continued)

*Primary Examiner*—Michael V Datskovskiy
(74) *Attorney, Agent, or Firm*—Frank R. Niranjan

(57) ABSTRACT

A heat dissipation device adapted for dissipating heat from a heat-generating electronic element, includes a plurality of fins assembled together. Each of the fins has a rectangular body and four arch-shaped flanges extending from edges of the body to form four round corners in four corners of the body. Each main body of the fins defines a plurality of locking members thereon to engage with corresponding locking members of a corresponding front fin. The arch-shaped flanges in four respective corners of the fins cooperate with each other to form four arced faces in four corners of the assembled fins along an entire length of the assembled fins.

15 Claims, 2 Drawing Sheets

U.S. PATENT DOCUMENTS

2006/0144560 A1* 7/2006 Lo ........................... 165/80.3
2007/0215318 A1* 9/2007 Chiang ...................... 165/78
2009/0183863 A1* 7/2009 Shu ........................... 165/170

* cited by examiner

HEAT DISSIPATION DEVICE HAVING AN IMPROVED FIN STRUCTURE

BACKGROUND OF THE INVENTION

1. Field of the Invention

The disclosure relates generally to a heat dissipation device, and more particularly to a heat dissipation device having a plurality of fins to remove heat from an electronic heat-generating component, wherein the fins have an improved structure.

2. Description of Related Art

Heat sinks are usually used to remove heat from heat-generating electronic components, such as central processing units (CPUs), power transistors, etc., to keep the components in stable operation. A typical heat sink comprises a base for contacting a heat-generating component to absorb heat generated by the heat-generating component and a plurality of parallel planar fins attached to the base by soldering or adhering. The fins are used for dissipating the heat to the ambient environment.

Typically, the heat sink is a parallel fined heat sink, which is fabricated by processes including an extrusion process, a gang sawing process and a bonding process. It is known that thickness and number of the fins produced by the extrusion process is restricted by the structure limitation and stress loading limitation of a die. If the number of the fins increases, the die fingers become weaker thus easily break off. Therefore, the extrusion process is not suitable for fabricating the high-density fin heat sink. The gang sawing process is performed by cutting off portions of a metal block to produce fins having predetermined thickness, number, depth and gap, which results in a great loss of material. In the bonding process, each fin is individually bonded into a base of the heat sink, which is time-consuming and labor intensive. In addiction, the fins that are not well-bonded into the base are likely to fall and thus be detached from the base.

A current thermal resolution to overcome the problems mentioned above is to provide a composite fin unit having a plurality of individual fins assembled together. The fins each have at least a flange extending perpendicularly from at least an edge thereof. Each flange of the fins is provided with a locking structure thereon. The locking structure of each fin engages with the locking structures of the rear and front fins to assemble the fins together with their flanges oriented in a same direction. The density of the fins can be predetermined by width of the flanges and able to be increased dramatically. However, the fins which are usually rectangular sheets have sharp angles in their corners, and the flanges of the fins all have exposed sharp edges. The sharp corners and edges of the flanges and the fins are in a high risk of damaging components surrounding the heat-generating component and hurting an operator during installation.

What is needed is a heat sink which has a plurality of individual fins assembled together to obtain a fin unit which has a high density of fins and is safe in installation and in use.

SUMMARY OF THE INVENTION

The present invention relates to a heat dissipation device adapted for dissipating heat from a heat-generating electronic element, includes a plurality of fins assembled together. Each of the fins has a rectangular body and four arch-shaped flanges extending from edges of the body to form four round corners in four corners of the body. Each main body of the fins defines a plurality of locking members thereon to engage with corresponding locking members of a corresponding front fin. The arch-shaped flanges in four respective corners of the fins cooperate with each other to form four arced faces in four corners of the assembled fins along an entire length of the assembled fins.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
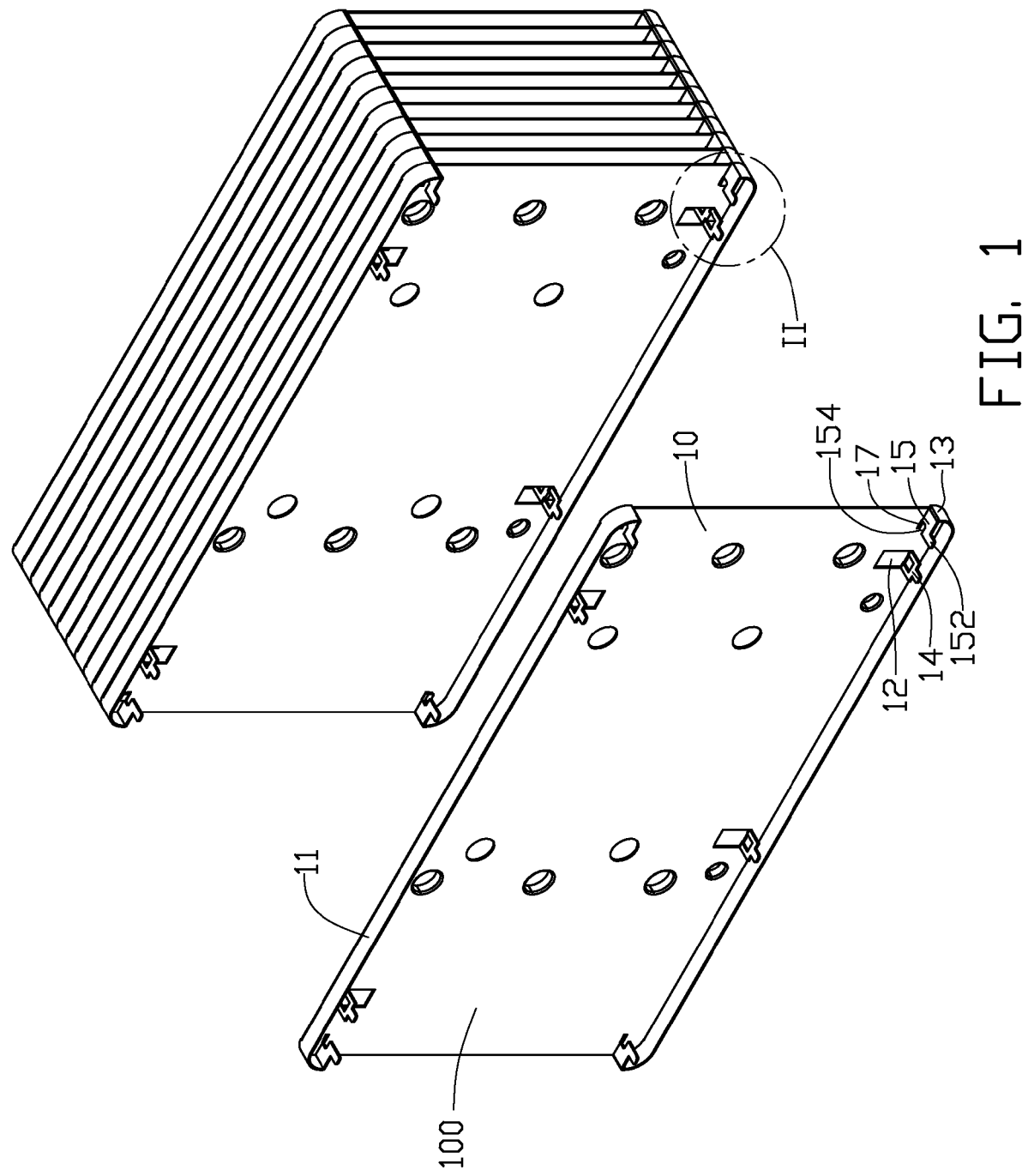
FIG. 1 is an assembled view of a heat dissipation device in accordance with a preferred embodiment of the present invention, with a fin being separated from the others.
Figure 2:
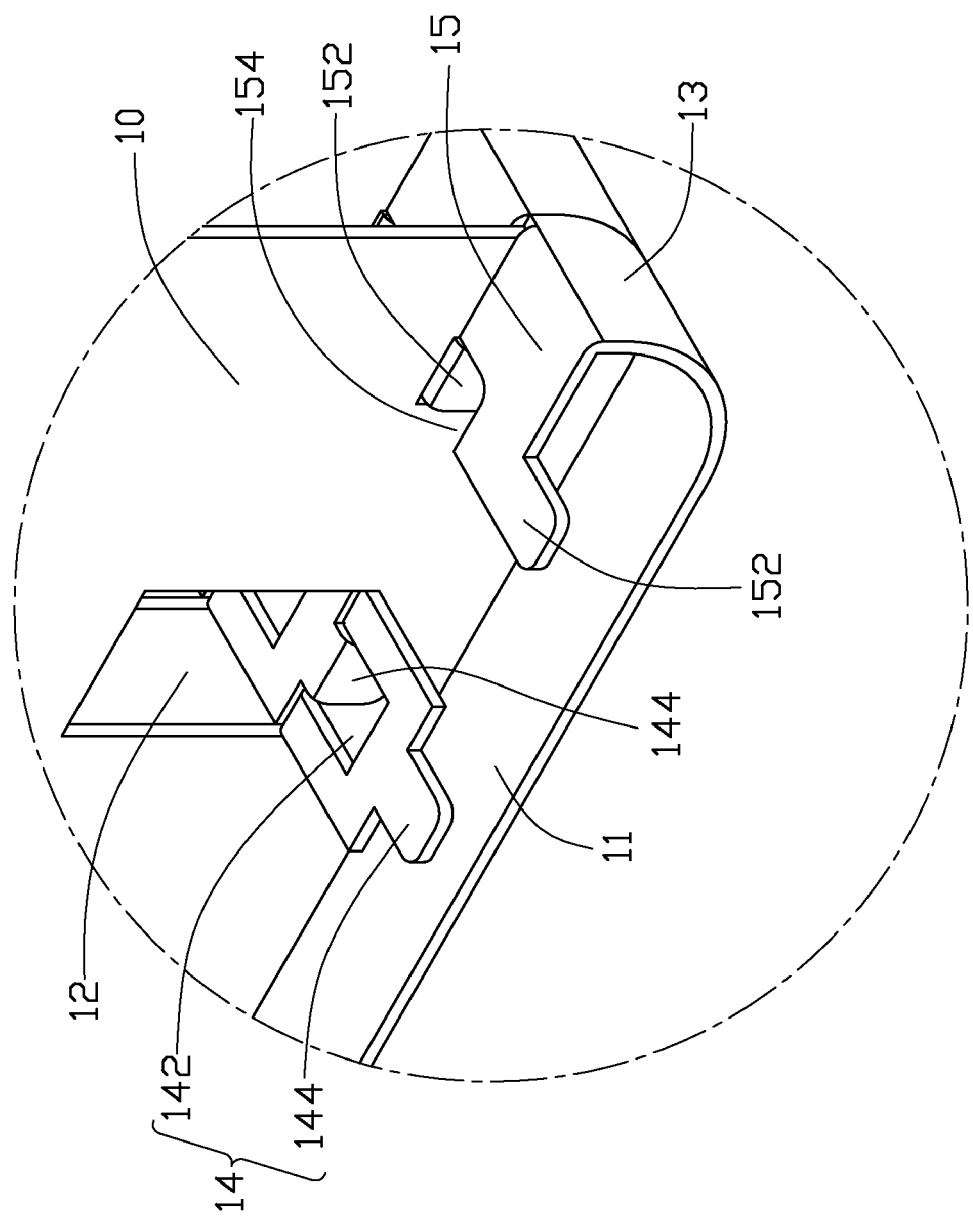
FIG. 2 is an enlarged view of a circled portion II of the heat dissipation device in FIG. 1.

Referring to FIGS. 1-2, a heat dissipation device in accordance with a preferred embodiment of the present invention is used for removing heat from a heat-generating component mounted on a printed circuit board. The heat dissipation device includes a plurality of fins 10 assembled together and attached to the heat-generated component in a thermal conductive relationship.

The fins 10 are made of thin metallic sheets, and identical to each other in configuration. Each of the fins 10 comprises a rectangular main body 100 and two flanges 11 respectively extending perpendicularly and forwardly from upper and lower edges of the main body 100. When the fins 10 are assembled together, all of the upper flanges 11 and the lower flanges 11 cooperate with each other to respectively form a flat upper surface and a lower surface. The lower surface is for contacting with the heat-generated component, or alternatively, being soldered on a conductive plate (not shown), which is in turn in contacting with the heat-generating component. Each of the fins 10 is provided with two pairs of spaced first locking members (not labeled) in the main body 100 and four second locking members (not labeled) respectively in four corners thereof.

Each of the first locking members includes a rectangular locking hole 12 adjacent to a corresponding one of the upper and lower flanges 11 thereof and a locking patch 14 projecting forwardly from an inner edge of the main body 100 corresponding to the locking hole 12. The locking patch 14 defines a receiving opening 142 therein, which is in communication with the corresponding locking hole 12. The locking patch 14 perpendicular to the main body 100 has a latching part 144 protruding forwardly from a middle portion of a front end thereof for engaging into a receiving opening 142 of a front fin 10 to assemble the two neighboring fins 10 together.

The main body 100 of each of the fins 10 has four round corners instead of right angle corners and four arch-shaped flanges 13 respectively extending forwardly and perpendicularly from edges of the four round corners. The arch-shaped flanges 13 are respectively connected to the upper and lower flanges 11 and curved inwardly from ends of the flanges 11. Each of the second locking members includes a locking sheet 15 extending inwardly from a free end of one of the arch-shaped flanges 13 and a locking slot 17 in the main body 100 of the fin 10. The locking slot 17 is located adjacent to an inner side of the locking sheet 15 and oriented in a horizontal line with the locking sheet 15. The locking sheet 15 also protrudes forwardly and perpendicularly from the main body 100 and is parallel to the upper and lower flanges 11. The locking sheet 15 defines a rectangular recess 154 in an inner edge thereof and in alignment with the corresponding locking slot 17. The locking sheet 15 has a retaining part 152 projecting forwardly from a front thereof and in alignment with the corresponding rectangular recess 154 along a front-to-rear direction. The locking slot 17 has a configuration in complementary with the retaining part 152 and the retaining part 152 is extended through a corresponding locking slot 17 to engage into the rectangular recess 154 of the front fin 10 to assemble the two adjacent fins 10 together.

In assembly, the locking parts 144 of the first locking members of each of the fins 10 are respectively extended forwardly through the locking holes 12 of a corresponding front fin 10 and received in the receiving openings 142 of the first locking members of the corresponding front fins 10; simultaneously, the retaining parts 152 of the second locking members of each of the fins 10 are respectively extended forwardly through the locking slots 17 and received in the rectangular recesses 154 of the first locking members of the corresponding front fin 10. To securely assemble the fins 10 together, the locking parts 144 of the first locking members and the retaining parts 152 of the second locking members are bent perpendicularly toward the adjacent upper or lower flanges 11 to abut against the front face of the main body 100 of the corresponding front fin 10. When the fins 10 are assembled together, the arch-shaped flanges 13 in four respective corners of the fins 10 cooperate with each other to form four arced faces in four corners of the fins 10 along an entire length of the fins 10. The four arced faces are respectively located at opposite ends of the upper and lower flat faces formed by the flanges 11, whereby the fins 10 in assembly have no sharp angles in four corners thereof, thus, the heat dissipation device formed by the fins 10 assembled together would not be in a risk of interfering or damaging the components mounted around the heat dissipation device or hurting operators mounting the heat dissipation device.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat from a heat-generating electronic element, comprising:
a plurality of fins assembled together, each of the fins comprising a rectangular main body and four arch-shaped flanges extending from edges of the main body to form four round corners in four corners of the main body, the main body of each of the fins extending a plurality of locking members to engage with corresponding locking members of a corresponding front fin;
wherein the arch-shaped flanges in four respective corners of the main body of each of the fins cooperate with the arch-shaped flanges in the corresponding front fin to form four arced faces in four corners of the assembled fins along an enter length of the assembled fins.

2. The heat dissipation device of claim 1, wherein each of the fins extends an upper flange and a lower flange from upper and lower edges of the main body, the upper flange connecting with two upper ones of the arch-shaped flanges, the lower flange connecting with two lower ones of the arch-shaped flanges.

3. The heat dissipation device of claim 2, wherein the locking members of each of the fins comprise two pairs of spaced first locking members respectively adjacent to the upper and lower flanges, each of the first locking members comprising a locking patch projecting forwardly, extended through the main body of the corresponding front fin and bent to abut against a front face of the main body of the corresponding front fin.

4. The heat dissipation device of claim 3, wherein the main body of each of the fins defines a plurality of locking holes located neighboring the locking patches, respectively, and the locking patches each define a receiving opening communicating a corresponding locking hole and have a latching part protruding forwardly from a front end thereof to extend through a corresponding locking hole to engage into a corresponding receiving opening of the corresponding front fin.

5. The heat dissipation device of claim 1, wherein the locking members comprise second locking members in corners of each of the fins, each of the second locking members comprising a locking sheet bent inwardly from a free end of a corresponding arch-shaped flange.

6. The heat dissipation device of claim 4, wherein the main body of each of the fins defines a plurality of locking slots therein respectively in alignment with the locking sheets, each of the lock sheets defines a recess in communicating with a corresponding locking slot and having a retaining part projecting forwardly from a front end thereof and extending through a corresponding locking slot to engage into a corresponding recess of the corresponding front fin.

7. The heat dissipation device of claim 6, wherein the retaining part is bent toward one of the upper and lower flanges of the corresponding front fin after passing through the corresponding locking slot of the corresponding front fin to abut against a front face of the corresponding front fin.

8. The heat dissipation device of claim 6, wherein the locking sheets are parallel to the upper and lower flanges and perpendicular to the main body of each of the fins.

9. A heat dissipation device adapted for dissipating heat from a heat-generating electronic element, comprising:
a group of fins assembled together, each fin having four round corners in four corners of a main body thereof, four arch-shaped flanges extending forwardly from edges of the four round corners, two flanges respectively extending forwardly from upper and lower edges of the main body and a plurality of spaced locking members formed at a front face thereof and engaging with corresponding locking members of a corresponding front fin;
wherein all of the upper flanges and lower flanges are arranged in successive and cooperatively define a flat upper surface and a lower surface parallel to the upper surface, the arch-shaped flanges in four respective corners of the fins cooperating with each other to form four arced faces in four corners of the assembled fins along an entire length of the assembled fins, the arch-shaped flanges connecting to two opposite sides of the upper and lower flat faces.

10. The heat dissipation device of claim 9, wherein the locking members of each fin comprise two pairs of spaced first locking members respectively adjacent to the upper and lower flanges, each of the first locking members comprising a locking patch projecting forwardly, extended through the corresponding front fin and bent to abut against a front face of the corresponding front fin.

11. The heat dissipation device of claim 10, wherein the fins each define a plurality of locking holes respectively adjacent to the locking patches, and the patches each define a receiving opening communicating with a corresponding through hole and have a latching part protruding forwardly from a middle portion of a front end thereof for extending through a corresponding locking hole to engage into a corresponding receiving opening of the corresponding front fin.

12. The heat dissipation device of claim 9, wherein the locking members comprise second locking members in corners of the fins, each of the second locking members comprising a locking sheet bent inwardly from a free end of a corresponding arch-shaped flanges.

13. The heat dissipation device of claim 12, wherein the fins each define a plurality of locking slots therein respectively in alignment with the locking sheets, and each of the lock sheets defines a recess in communicating with corresponding locking slot and having a retaining part projecting forwardly from a front end thereof and extending through a corresponding locking slot to engage into a corresponding recess of the corresponding front fin.

14. The heat dissipation device of claim 13, wherein the retaining part is bent toward one of the upper and lower flanges of the corresponding front fin after passing through the corresponding locking slot of the corresponding front fin to abut against a front face of the corresponding front fin.

15. The heat dissipation device of claim 14, wherein the locking sheets are parallel to the upper and lower face formed by the successive upper and lower flanges and perpendicular to the main body of each of the fins.

* * * * *